United States Patent
Antoniswamy et al.

(10) Patent No.: US 10,969,840 B2
(45) Date of Patent: Apr. 6, 2021

(54) HEAT SPREADERS WITH INTERLOCKED INSERTS

(71) Applicant: Intel Corporation, Santa Clara, CA (US)

(72) Inventors: Aravindha R. Antoniswamy, Phoenix, AZ (US); Syadwad Jain, Chandler, AZ (US); Zhizhong Tang, Tempe, AZ (US); Wei Hu, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 3 days.

(21) Appl. No.: 15/768,915

(22) PCT Filed: Nov. 16, 2015

(86) PCT No.: PCT/US2015/060832
§ 371 (c)(1),
(2) Date: Apr. 17, 2018

(87) PCT Pub. No.: WO2017/086912
PCT Pub. Date: May 26, 2017

(65) Prior Publication Data
US 2019/0079567 A1 Mar. 14, 2019

(51) Int. Cl.
*G06F 1/20* (2006.01)
*H01L 21/48* (2006.01)
*H01L 23/40* (2006.01)
*H01L 23/373* (2006.01)
(Continued)

(52) U.S. Cl.
CPC .......... *G06F 1/206* (2013.01); *H01L 21/4871* (2013.01); *H01L 21/4882* (2013.01); *H01L 23/36* (2013.01); *H01L 23/3675* (2013.01); *H01L 23/3736* (2013.01); *H01L 23/40* (2013.01)

(58) Field of Classification Search
CPC . G06F 1/206; H01L 21/4882; H01L 23/3736; H01L 21/4871; H01L 23/36; H01L 23/3675; H01L 23/40
USPC .................................................. 361/704, 710
See application file for complete search history.

(56) References Cited

U.S. PATENT DOCUMENTS 5,886,407 A * 3/1999 Polese .................... B22F 1/0003
257/706
6,003,586 A * 12/1999 Beane .................... B22D 18/06
164/63
(Continued)

OTHER PUBLICATIONS

International Search Report and Written Opinion issued in PCT Application No. PCT/US2015/060832 dated Jul. 19, 2016; 7 pages.

*Primary Examiner* — Anatoly Vortman
(74) *Attorney, Agent, or Firm* — Patent Capital Group

(57) ABSTRACT

Disclosed herein are embodiments of heat spreaders with interlocked inserts, and related devices and methods. In some embodiments, a heat spreader may include: a frame formed of a first material, wherein the frame includes an opening, a projection of the frame extends into the opening, and the projection has a top surface, a side surface, and a bottom surface; a recess having at least one sidewall formed by the frame; and an insert formed of a second material different from the first material, wherein the insert is disposed in the frame and in contact with the top surface, the side surface, and the bottom surface of the projection.

21 Claims, 8 Drawing Sheets

(51) Int. Cl.
*H01L 23/367* (2006.01)
*H01L 23/36* (2006.01)

(56) References Cited

U.S. PATENT DOCUMENTS

| | | | | |
|---|---|---|---|---|
| 6,046,498 | A * | 4/2000 | Yoshikawa | H01L 23/4338 257/706 |
| 6,680,015 | B2 * | 1/2004 | McCullough | H01L 21/4871 257/720 |
| 6,702,007 | B1 * | 3/2004 | Pan | H01L 23/36 165/185 |
| 6,758,263 | B2 * | 7/2004 | Krassowski | F28F 13/00 165/185 |
| 6,791,183 | B2 * | 9/2004 | Kanelis | H01L 23/4093 257/712 |
| 7,219,721 | B2 * | 5/2007 | Miyazaki | H01L 23/367 165/185 |
| 7,443,683 | B2 * | 10/2008 | Searby | H01L 23/427 257/720 |
| 7,999,373 | B2 * | 8/2011 | Baldauf | H01L 23/367 257/712 |
| 8,866,290 | B2 * | 10/2014 | Tang | H01L 23/367 164/108 |
| 9,437,515 | B2 * | 9/2016 | Colgan | H01L 23/36 |
| 10,424,559 | B2 * | 9/2019 | Eid | H01L 23/49827 |
| 2008/0111234 | A1 | 5/2008 | Hua et al. | |
| 2008/0296756 | A1 | 12/2008 | Koch et al. | |
| 2009/0027857 | A1 | 1/2009 | Dean et al. | |
| 2014/0151871 | A1 | 6/2014 | Refai-Ahmed | |
| 2014/0239482 | A1 | 8/2014 | Kourakata et al. | |
| 2014/0264821 | A1 | 9/2014 | Tang et al. | |
| 2015/0357258 | A1 * | 12/2015 | Fitzgerald | H01L 23/3675 257/713 |
| 2019/0027379 | A1 * | 1/2019 | Hu | H01L 21/4871 |

\* cited by examiner

```
                    ┌─────────────────────────────────────┐
                    │   INTERFERENCE FITTING AN INSERT IN AN│
                    │  OPENING OF A FRAME, WHEREIN THE FRAME IS│
                    │  FORMED OF A FIRST MATERIAL, A PROJECTION│
                    │  OF THE FRAME EXTENDS INTO THE OPENING,│
                    │  THE PROJECTION HAS A TOP SURFACE, A SIDE│
                    │   SURFACE, AND A BOTTOM SURFACE, AND THE│
                    │    INSERT IS FORMED OF A SECOND MATERIAL│
                    │    HAVING A HIGHER THERMAL CONDUCTIVITY│
                    │           THAN THE FIRST MATERIAL│
                    │                  2002               │
                    └─────────────────────────────────────┘
```

2000 — process flow

Step 2002: INTERFERENCE FITTING AN INSERT IN AN OPENING OF A FRAME, WHEREIN THE FRAME IS FORMED OF A FIRST MATERIAL, A PROJECTION OF THE FRAME EXTENDS INTO THE OPENING, THE PROJECTION HAS A TOP SURFACE, A SIDE SURFACE, AND A BOTTOM SURFACE, AND THE INSERT IS FORMED OF A SECOND MATERIAL HAVING A HIGHER THERMAL CONDUCTIVITY THAN THE FIRST MATERIAL

Step 2004: DEFORMING THE INSERT AROUND THE PROJECTION SUCH THAT THE INSERT IS IN CONTACT WITH THE TOP SURFACE, THE SIDE SURFACE, AND THE BOTTOM SURFACE OF THE PROJECTION

FIG. 20

HEAT SPREADERS WITH INTERLOCKED INSERTS

CROSS-REFERENCE TO RELATED APPLICATION

This application is a national stage application under 35 U.S.C. § 371 of PCT International Application Serial No. PCT/US2015/060832, filed on Nov. 16, 2015 and entitled "HEAT SPREADERS WITH INTERLOCKED INSERTS," which is hereby incorporated by reference in its entirety.

TECHNICAL FIELD

The present disclosure relates generally to the field of thermal management and, more particularly, to heat spreaders with interlocked inserts.

BACKGROUND

Heat spreaders may be used to move heat away from an active electronic component so that it can be more readily dissipated by a heat sink or other thermal management device. Heat spreaders are conventionally stamped from copper and have a nickel coating.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIG. 20 is a flow diagram of a method of manufacturing a heat spreader, in accordance with various embodiments.

DETAILED DESCRIPTION

Figure 1:
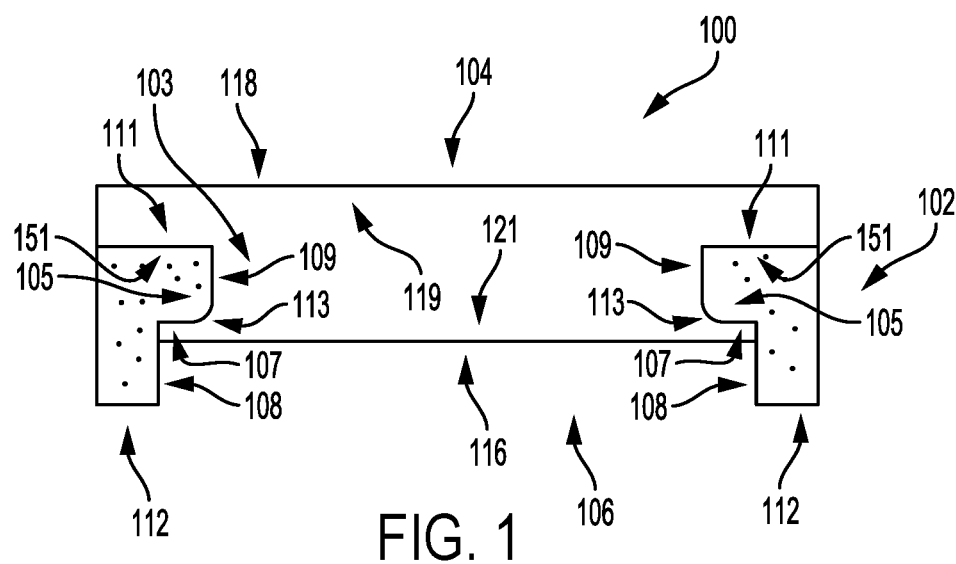
FIG. 1 is a side cross-sectional view of an example heat spreader, in accordance with various embodiments.

Disclosed herein are embodiments of heat spreaders with interlocked inserts, and related devices and methods. In some embodiments, a heat spreader may include: a frame formed of a first material, wherein the frame includes an opening, a projection of the frame extends into the opening, and the projection has a top surface, a side surface, and a bottom surface; a recess having at least one sidewall formed by the frame; and an insert formed of a second material different from the first material, wherein the insert is disposed in the frame and in contact with the top surface, the side surface, and the bottom surface of the projection.

Various ones of the embodiments disclosed herein may provide improved thermal management for complex computing device designs, such as those involving multiple integrated circuit (IC) packages of different heights and footprints distributed on a circuit board. Such complex computing device designs may arise in large computing server applications, "patch/package on interposer" configurations, and "package on package" configurations, among others. Additionally, various ones of the embodiments disclosed herein may be beneficially applied in computing tablets in which it may be advantageous to dissipate heat from computing components in the tablet both in the direction normal to the plane of the tablet and within the plane of the tablet. Various ones of the embodiments disclosed herein may include innovative material combinations, manufacturing techniques, and geometrical features.

Conventional techniques for forming heat spreaders typically involve stamping the heat spreader from a sheet of copper material. However, as IC packages grow and become more powerful, larger and thicker heat spreaders with more complex geometries may be desired. For example, it may be useful to have a heat spreader that is capable of moving heat from multiple silicon die of varying heights. However, the multi-hundred-ton presses required for stamping such heat spreaders are prohibitively large and expensive for practical use and may not even be capable of forming the desired geometries. Additionally, conventional stamping techniques are limited by the conventional practical maximum thickness of the copper sheet used during stamping. This copper sheet is typically provided on a roll and can only be wound so tightly before the copper begins to undesirably deform. Conventional techniques have been limited to copper sheets that are 3.2 mm thick or less, which limits the thickness of the heat spreader that can be formed from such sheets to 3.2 mm or less.

Additionally, the thermal management needs of a computing device may not require a heat spreader to be formed entirely from copper; for example, less heat may need to be dissipated at the edges of a large heat spreader than in the portions of the heat spreader closer to active dies. Because stamping a heat spreader from a copper sheet results in a heat spreader that is entirely formed from copper, and because copper is an expensive material, traditional stamping techniques may be both expensive and materially wasteful for some applications.

The use of stamping to form heat spreaders can also reduce the thermal and mechanical performance of a heat spreader, especially for complex geometries that require high-tonnage presses. In particular, the regions of the heat spreader that undergo very high deformation (such as the sidewalls of recesses in a heat spreader) are prone to recrystallize during surface mount reflow because of the stored plastic energy imparted to the material during stamping. Upon recrystallization, the strength of the heat spreader drops dramatically, and the heat spreader may warp or break.

Use of various ones of the embodiments disclosed herein may enable formation of heat spreaders with complex geometry at relatively low cost. This may allow powerful processing packages (e.g., central processing unit packages) with supporting memory chips to be cooled with a single large heat spreader. This may reduce cost overall and improve functionality, making new computing device designs (e.g., server designs) possible. Additionally, as cooler processors typically use less electricity and have improved reliability, use of various ones of the embodiments disclosed herein may provide an overall improvement in computing device performance. Various ones of the manufacturing operations using the manufacturing techniques disclosed herein (e.g., stamping, trimming, interference fitting, and local plastic deformation through forging) may be performed reliably, accurately, and at low cost, further enabling the development of improved heat spreader designs.

In the following detailed description, reference is made to the accompanying drawings that form a part hereof wherein like numerals designate like parts throughout, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. Although various elements may be provided with different reference numerals in one or more of the accompanying cross-sectional drawings, these elements may be coupled outside of the plane of the cross section, or they may be separate.

FIG. 1 is a side cross-sectional view of an example heat spreader 100, in accordance with various embodiments. The heat spreader 100 of FIG. 1 may include a frame 102 formed of a first material. The frame 102 may include an opening 103, and a first projection 105 of the frame 102 may extend into the opening 103. The first projection 105 may have a top surface 111, a side surface 109, and a bottom surface 107.

Figure 3:
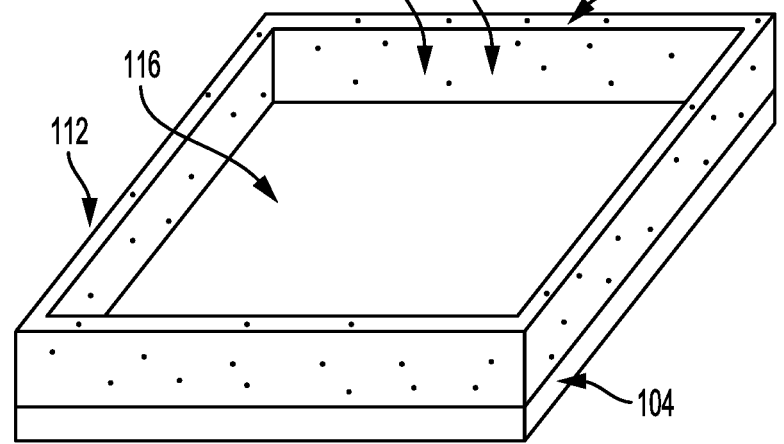

The heat spreader 100 may include a recess 106 having at least one sidewall 108 formed by the frame 102. In the embodiment shown in FIG. 1, the frame 102 may include a second projection 112, extending perpendicularly to the first projection 105, that provides the sidewalls 108 of the recess 106. As illustrated in FIG. 3 (which provides a bottom perspective view of the example heat spreader 100 of FIG. 1), the second projection 112 may provide all four sidewalls 108 of the recess 106.

An insert 104 may be disposed in the frame 102 and may be in contact with the top surface 111, the side surface 109, and the bottom surface 107 of the first projection 105 of the frame 102. In some embodiments, as discussed below with reference to FIGS. 11-20, the manufacture of the heat spreader 100 may include interference fitting the insert 104 into the opening 103, then to forming the insert 104 around the first projection 105 such that the insert 104 is in contact with the top surface 111, the side surface 109, and the bottom surface 107 of the first projection 105.

The insert 104 may be formed of a second material having a higher thermal conductivity than the first material of the frame 102, and thus the insert 104 may transfer heat more effectively than the frame 102. The selection of an appropriate second material for the insert 104 may depend on the selection of the first material for the frame 102. In particular, it may be desirable for the first material of the frame 102 to be stronger and/or tougher than the second material of the insert 104. In such embodiments, the frame 102 may substantially provide mechanical robustness to the heat spreader 100 (while secondarily providing heat transfer capability) while the insert 104 may substantially provide heat transfer capability to the heat spreader 100 (while secondarily providing mechanical robustness). For example, the first material of the frame 102 may have a higher-yield strength than the second material of the insert 104. In another example, the first material of the frame 102 may have a higher toughness than the second material of the insert 104.

In some embodiments, the first material of the frame 102 may include stainless steel, aluminum, or brass. For example, stainless steel in full-hard temper may be used. In embodiments in which the first material of the frame 102 includes aluminum, an alloy of aluminum (e.g., 6061) with a T6 temper may be suitable. Aluminum and brass may both have higher thermal conductivities and stainless steel. The second material of the insert 104 may desirably be ductile in order to facilitate the shaping of the insert 104 around the first projection 105 (e.g., as discussed below with reference to FIGS. 11-13). In some embodiments, the second material of the insert 104 may include copper (e.g., fully annealed copper), aluminum (e.g., fully annealed aluminum), or brass. The insert 104 may be formed of a core material coated with a coating material; for example, the insert 104 may be formed of nickel-plated copper. In embodiments in which the insert 104 includes copper, the copper may be high-grade oxygen-free copper, or may be a lower-grade copper, such as electrolytic tough-pitch copper or deoxidized high-phosphorus copper (e.g., suitable in applications or regions of a particular heat spreader 100 in which the high thermal conductivity of oxygen-free copper is not required). In embodiments in which the insert 104 includes brass, the brass may be gilding metal (e.g., a low-zinc brass that may be suitable when the high thermal conductivity of oxygen-free copper is not required). The use of lower-cost materials, such as lower-grade coppers and gilding metal, may reduce the raw material cost of the heat spreader 100. When the heat spreader 100 is to be laser-marked (e.g., on a top outer surface 118), it may be desirable for the second material of the insert 104 to include nickel or a noble metal (e.g., ruthenium, rhodium, palladium, silver, osmium, iridium, platinum, or gold) at the top surface 119 of the insert 104. Other materials that may be used in the insert 104 may be more difficult to laser-mark at the top outer surface 118 (such as copper, which may oxidize heavily). In some embodiments, the second material of the insert 104 may have an O or T4 temper (which may be "softer" than a T6 temper, for example).

In some embodiments, the first material of the frame 102 may have a higher coefficient of thermal expansion than the second material of the insert 104. This may be desirable when the frame 102 is to be shrink-fit around the insert 104 during manufacture of the heat spreader 100. However, too great a mismatch between the coefficients of thermal expansion may result in different amounts of expansion and contraction of the frame 102 and the insert 104 in use, and thus may lead to mechanical decoupling or other mechanical failure of the heat spreader 100. The amount of tolerable mismatch in the coefficients of thermal expansion between the first material of the frame 102 and the second material of the insert 104 may be dictated by the expected temperature cycling during use and the particular geometry of the heat spreader 100, as known in the art. In some embodiments, an insert 104 formed of copper (e.g., nickel-plated copper) and a frame 102 formed of stainless steel may be appropriately matched.

Figure 2:
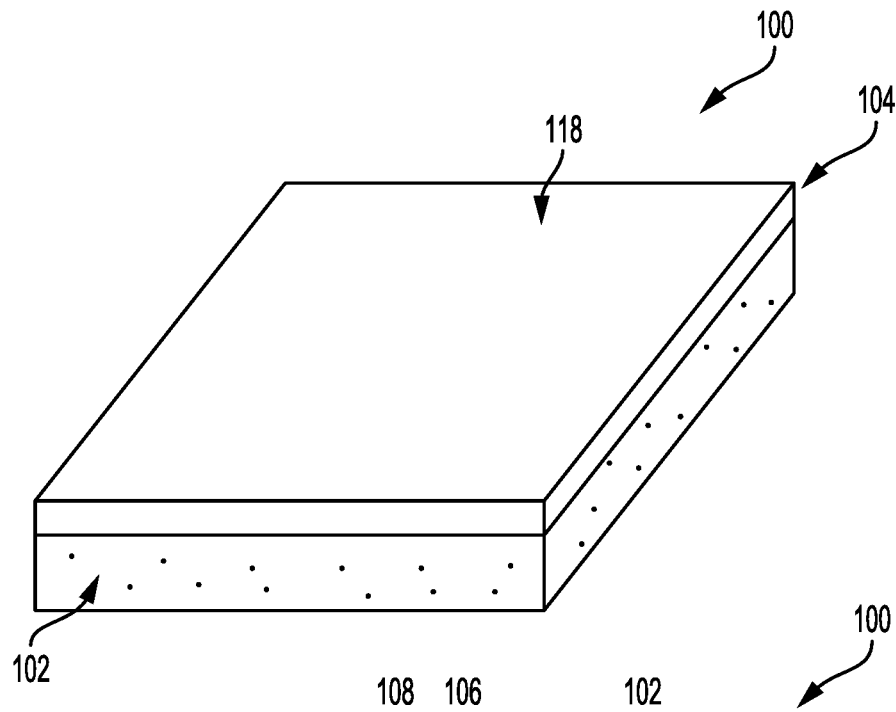
FIGS. 2 and 3 are top and bottom perspective views, respectively, of the example heat spreader of FIG. 1, in accordance with various embodiments.

FIGS. 2 and 3 are top and bottom perspective views, respectively, of the example heat spreader 100 of FIG. 1, in accordance with various embodiments. Although FIGS. 2 and 3 show the heat spreader 100 of FIG. 1 as having a substantially rectangular footprint, this need not be the case, and the heat spreader 100 of FIG. 1 (and any other heat spreaders disclosed herein) may have footprints of any desired shape. Additionally, the insert 104 and the frame 102 need not have footprints of the same shape. For example, the insert 104 may have a rectangular footprint with an aspect ratio that is different from an aspect ratio of a rectangular footprint of the frame 102. Examples of embodiments in which multiple inserts 104 are included in a frame 102 are discussed below with reference to FIGS. 9-10 and 14-19. In another example, the insert 104 may have a curved footprint while the frame 102 may have a rectangular footprint.

As illustrated in FIGS. 1 and 2, the top surface 119 of the insert 104 may provide the top outer surface 118 of the heat spreader 100. In other words, the frame 102 may not be exposed on the top outer surface 118. Having the top outer surface 118 of the heat spreader 100 present a uniform material appearance, and a flat surface may reduce the likelihood that test tools will scratch or get stuck on any non-uniformities during handling of the heat spreader 100. Additionally, as illustrated in FIGS. 1 and 3, a bottom surface 121 of the insert 104 may be exposed at a recess bottom outer surface 116 of the heat spreader 100. In still other embodiments, the insert 104 may not be exposed at any outer surface and may instead be enclosed by a coating material provided to the heat spreader 100. An example of such a coating material may include nickel (e.g., when the frame 102 is formed of brass and the insert 104 is formed of copper), which may be plated on the heat spreader 100 to coat the entire outside of the heat spreader 100 in some embodiments (not shown in FIG. 1). As noted above, in some embodiments, the insert 104 may itself include a material coating (e.g., nickel) before it is disposed in the frame 102. When a nickel-coated top outer surface 118 of the heat spreader 100 is desired, it may be advantageous to nickel-coat the insert 104 prior to disposing the insert 104 in the frame 102 when the frame 102 is formed from stainless steel.

The top surface 111, the side surface 109, and the bottom surface 107 of the first projection 105 of FIG. 1 are illustrated as flat, but this need not be the case in all embodiments. In various embodiments, the top surface 111, the side surface 109, and the bottom surface 107 of the first projection 105 may be flat, curved (e.g., with a constant or variable radius or other curvature), or may include flat and curved regions. The side surface 109 illustrated in FIG. 1 is oriented substantially perpendicularly to the top surface 111 and to the bottom surface 107, but this need not be the case in all embodiments. For example, in some embodiments, the side surface 109 may be curved and/or angled relative to the top surface 111 and/or the bottom surface 107.

Figure 4:
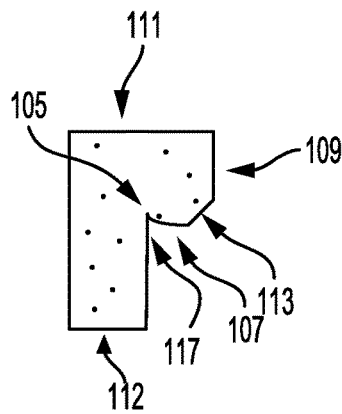
FIGS. 4-6 are side cross-sectional views of example portions of a frame of a heat spreader, in accordance with various embodiments.
Figure 6:
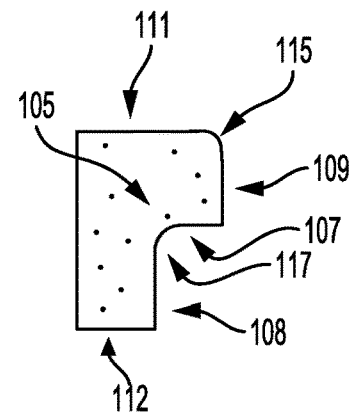

In some embodiments, transition surfaces may be disposed between the side surface 109 and the top surface 111 and/or the bottom surface 107. For example, the heat spreader 100 of FIG. 1 may include a transition surface 113 between the bottom surface 107 and the side surface 109. As illustrated in FIG. 1, the transition surface 113 may be curved. In other embodiments, a transition surface 113 between a bottom surface 107 and a side surface 109 of a first projection 105 may be flat, as illustrated in FIG. 4. In still other embodiments, a transition surface 113 includes a combination of flat and curved regions. In some embodiments, the first projection 105 may not include a transition surface 113 between the bottom surface 107 and the side surface 109 (e.g., as illustrated in FIG. 6).

The frame 102 may include a transition surface 115 between the side surface 109 and the top surface 111 of the first projection 105. The transition surface 115 may be flat (e.g., as illustrated with reference to FIG. 5), curved (e.g., as illustrated with reference to FIG. 6), or may be a combination of the two. In some embodiments, the first projection 105 may not include a transition surface 115 (e.g., as illustrated in FIGS. 1 and 4).

Figure 5:
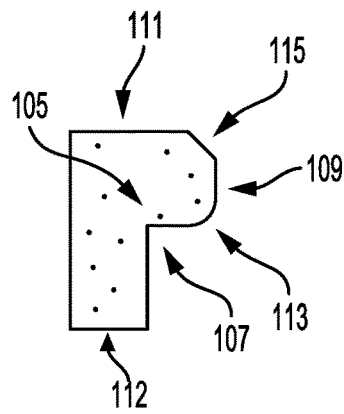

In some embodiments, the frame 102 may include a transition surface 117 between the bottom surface 107 of the first projection 105 and the second projection 112. For example, FIGS. 4 and 6 depict embodiments in which the frame 102 includes a curved transition surface 117 between the second projection 112 and the bottom surface 107 of the first projection 105. In the embodiment of FIG. 4, the transition surface 117 may form a "notch" in the first projection 105; the insert 104 may extend into this notch. In other embodiments, the frame 102 may include a flat transition surface 117, or a transition surface 117 having a combination of flat and curved regions. In other embodiments, the frame 102 may not include a transition surface 117 (e.g., as illustrated in FIGS. 1 and 5).

In the embodiment of the heat spreader 100 illustrated in FIG. 1, the insert 104 may have a substantially uniform "thickness" between the top surface 119 and the bottom surface 121, but this need not be the case. For example, as discussed below with reference to FIGS. 7-8, 10, and 17-19, the bottom surface 121 may include contours for various purposes. Additionally, although the top surface 119 is shown as flat in the embodiments illustrated herein, the top surface 119 may also include contours if suitable for the application. For example, if another thermal management component will be disposed on the top outer surface 118 of the heat spreader 100 during use (e.g., a heat sink), the top surface 119 may include a recess or another feature complementary to that thermal management component.

In use, the heat spreader 100 of FIG. 1 may be arranged in a computing device such that one or more integrated circuit (IC) packages 176 (not shown in FIG. 1) are disposed in the recess 106 and in thermal contact with the recess bottom outer surface 116. The heat spreader 100 may be secured to a substrate to which the IC package 176 is secured (e.g., a circuit board), or may be secured directly to the IC package 176 (e.g., using a direct lid attach (DLA) process).

Various examples of arrangements of heat spreaders 100 and IC packages 176 disposed within their recesses 106 are discussed below with reference to FIGS. 9 and 10.

Figure 7:
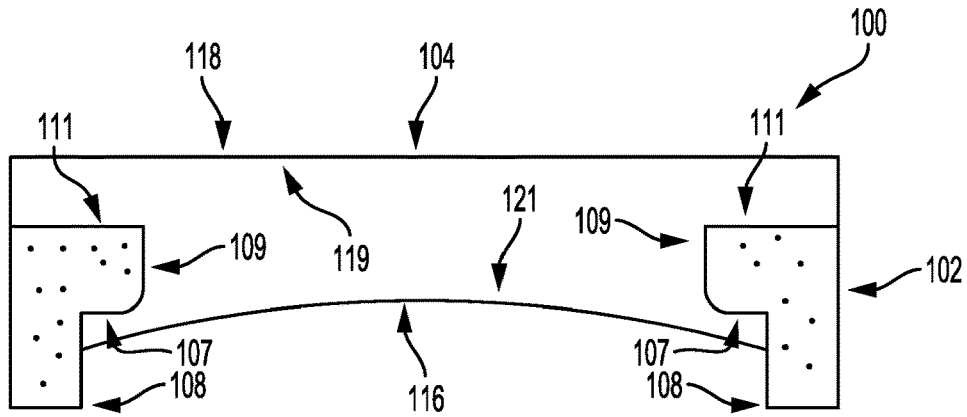
FIGS. 7-8 are side cross-sectional views of other example heat spreaders, in accordance with various embodiments.
Figure 8:
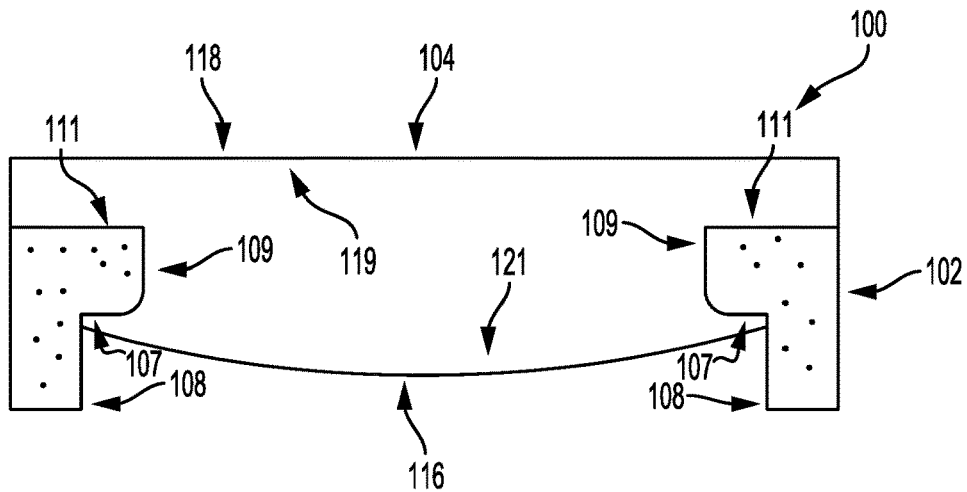

FIGS. 7 and 8 are side cross-sectional views of other example heat spreaders 100, in accordance with various embodiments. The heat spreaders 100 of FIGS. 7 and 8 may include a frame 102 formed of a first material, and a recess 106 having at least one sidewall 108 formed by the frame 102. In particular, the frame 102 of the embodiment of FIGS. 7 and 8 may include a second projection 112 forming the sidewalls 108. The frame 102 may include an opening 103 and a first projection 105 that extends into the opening 103. An insert 104, formed of a second material having a different thermal conductivity than the first material, may be disposed in the frame 102 so that the insert 104 is in contact with the top surface 111, the side surface 109, and the bottom surface 107 of the first projection 105. The frame 102 of the heat spreaders 100 of FIGS. 7 and 8 may take any of the forms discussed herein with reference to a frame 102 of a heat spreader 100, and the insert 104 of the heat spreaders 100 of FIGS. 7 and 8 may take any of the forms discussed herein with reference to an insert 104 of a heat spreader 100. For example, the footprint and perspective arrangement of the heat spreaders 100 of FIGS. 7 and 8 may take any of the forms discussed above with reference to the heat spreader 100 of FIGS. 1-3.

In the embodiment illustrated in FIG. 7, the bottom surface 121 of the insert 104 (providing the recess bottom outer surface 116) may have concave curvature with reference to the top surface 119 of the insert 104. In the embodiment illustrated in FIG. 8, the bottom surface 121 of the insert 104 may have convex curvature with reference to the top surface 119 of the insert 104. Embodiments in which the bottom surface 121 of the insert 104 has curvature may be particularly useful when the IC package 176 (not shown) (that will contact the recess bottom outer surface 116 during use) itself has curvature in its top surface (e.g., the top surface 177 illustrated in FIGS. 9 and 10). Many IC packages 176 may have such curvature across the top surfaces (e.g., on the order of several microns), and thus providing a heat spreader 100 with a curved recess bottom outer surface 116 complementary to the curvature of the IC package 176 may improve thermal contact between the heat spreader 100 and the IC package 176. In some embodiments, the bottom surface 121 of the insert 104 may have flat regions, concave curved regions, and/or convex curved regions (e.g., to accommodate multiple IC packages 176 or other features of a computing device).

As noted above, in use, the heat spreaders 100 of FIGS. 7 and 8 may be arranged in a computing device such that one or more IC packages 176 (not shown) are disposed in the recess 106 and in thermal contact with the recess bottom outer surface 116. The heat spreader 100 may be secured to a substrate to which the IC package 176 is secured (e.g., a circuit board) or to the one or more IC packages 176 themselves. Various examples of arrangements of heat spreaders 100 and IC packages 176 disposed within their recesses 106 are discussed below with reference to FIGS. 9 and 10.

Any of the embodiments and features of the heat spreaders 100 discussed above with reference to FIGS. 1-8 may be combined in any suitable manner in the design of a heat spreader in accordance with the present disclosure. For example, any of the profiles of the frame 102 (e.g., discussed above with reference to FIGS. 1 and 4-6 and illustrated in any of the accompanying FIGS.) may be combined with an insert 104 having any desired curvature of the bottom surface 121 (discussed above with reference to FIGS. 7-8).

Figure 14:
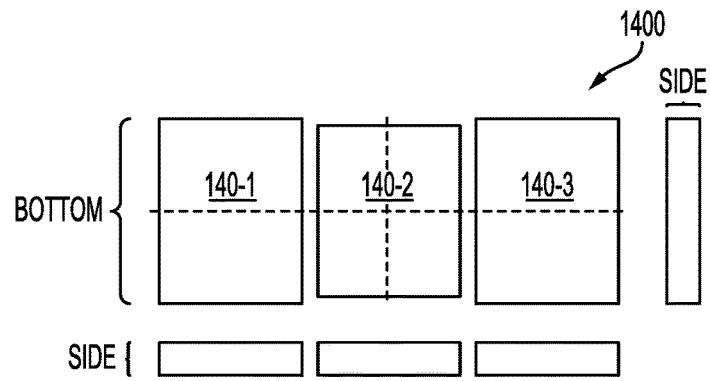
FIGS. 14-16 illustrate various stages in the manufacture of the example heat spreader of FIG. 9, in accordance with various embodiments.
Figure 15:
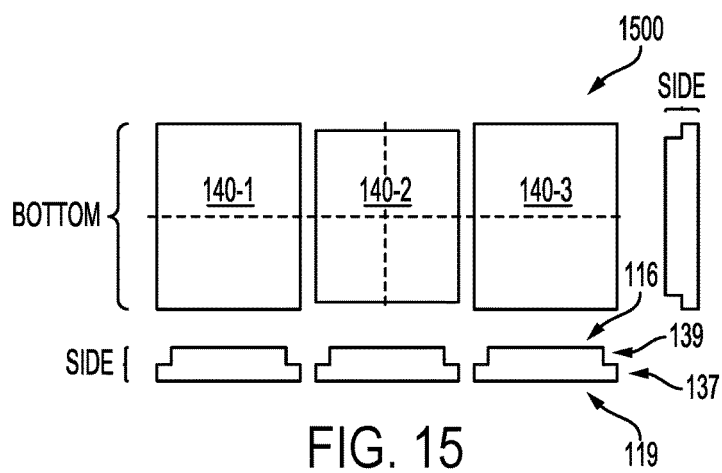
Figure 16:
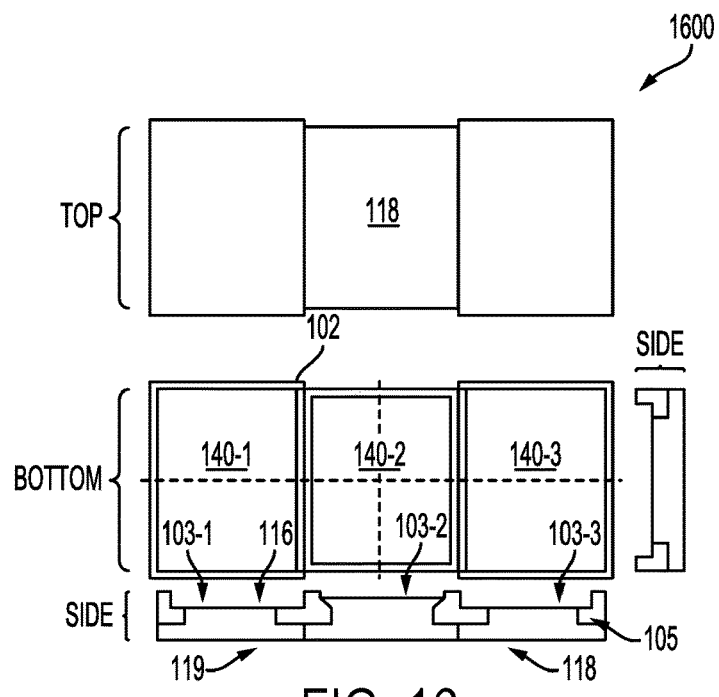

A heat spreader 100 may include multiple recesses 106 and/or multiple inserts 104. For example, FIG. 9 is an exploded side cross-sectional view of an example heat spreader 100 positioned above multiple IC packages 176 in a computing device 900, in accordance with various embodiments. FIGS. 14-16, discussed below, illustrate various stages in the manufacture of the example heat spreader 100 of FIG. 9, in accordance with various embodiments.

The heat spreader 100 may include a recess 106-1 having a recess bottom outer surface 116-1 and sidewalls 108-1, a recess 106-2 (adjacent to the recess 106-1) having a recess bottom outer surface 116-2 and sidewalls 108-2, and a recess 106-3 (adjacent to the recess 106-2) having a recess bottom outer surface 116-3 and sidewalls 108-3. A second projection 112-1 may define the sidewalls 108-2, while the second projection 112-1 and the second projection 112-2 may define the sidewalls 108-1 and 108-3, as shown.

In some embodiments of heat spreaders 100 having multiple recesses 106, the depths of different ones of the recesses 106 may be different. For example, in the heat spreader 100 of FIG. 9, the recess 106-2 may have a depth 179, while the recesses 106-1 and 106-3 may have a smaller depth 181. In other embodiments of heat spreaders 100 having multiple recesses 106, the depths of different ones of the recesses 106 may be the same.

The frame 102 may include openings 103-1, 103-2, and 103-3 (corresponding to the recesses 106-1, 106-2, and 106-3, respectively). First projections 105-11 and 105-12 may extend into the opening 103-1, first projections 105-21 and 105-22 may extend into the opening 103-2, and first projections 105-31 and 105-32 may extend into the opening 103-3. Different ones of the first projections 105 may have different geometries (e.g., any of the geometries discussed above with reference to FIGS. 1-8).

The heat spreader 100 may include an insert 104-1 disposed proximate to the recess 106-1 in the opening 103-1; an insert 104-2 disposed proximate to the recess 106-2 in the opening 103-2, and an insert 104-3 disposed proximate to the recess 106-3 in the opening 103-3. These inserts 104 may be disposed in the frame 102, and may each be formed of second materials having higher thermal conductivities than the first material of the frame 102. The inserts 104 of the heat spreader 100 of FIG. 9 may take any of the forms discussed above with reference to the inserts 104 of FIGS. 1-8. For example, different ones of the inserts 104 in the heat spreader 100 of FIG. 6 may be formed of different materials and/or may have different geometries (e.g., any of the geometries discussed above with reference to FIGS. 1-8). In some embodiments, the inserts 104-1, 104-2, and 104-3 may be multiple different single gauge strips, as discussed below with reference to FIGS. 14-16. As illustrated in FIG. 9, the inserts 104-1, 104-2, and 104-3 may together provide the top outer surface 118 of the heat spreader 100. The heat spreader 100 of FIG. 9 made give the appearance of a uniform, single-piece heat spreader from the top, making the heat spreader 100 of FIG. 9 visually similar to single-piece heat spreaders. This "top view" similarity may make it possible for the same manufacturing equipment to process both the heat spreaders 100 disclosed herein and conventional all-copper stamped heat spreaders, providing advantageous flexibility in design and operations. In some embodiments, the top outer surface 118 may be flat.

As noted above, FIG. 9 is an exploded side cross-sectional view of an example heat spreader 100 positioned above multiple IC packages 176 in a computing device 900. The IC packages 176 are shown in FIG. 9 as mounted to a circuit board 178; during use, the recess bottom outer surface 116-1 of the heat spreader 100 may be brought into contact with the top surface 177-1 of the IC package 176-1 such that the IC package 176-1 is disposed in the recess 106-1; the recess bottom outer surface 116-2 may be brought into contact with the top surface 177-2 of the IC package 176-2 such that the IC package 176-2 is disposed in the recess 106-2; and the recess bottom outer surface 116-3 may be brought into contact with the top surface 177-3 of the IC package 176-3 such that the IC package 176-3 is disposed in the recess 106-3. The heat spreader 100 may be secured to the IC packages 176 using an adhesive, for example. In some embodiments, the heat spreader 100 may be secured to the circuit board 178 (e.g., using an adhesive or a mechanical fastener) instead of or in addition to the top surfaces 177 of the IC packages 176.

The IC packages 176 may be in thermal contact with the recess bottom outer surfaces 116 of their respective recesses 106; this may include, for example, having the top surfaces 177 of the IC packages 176 in direct physical contact with the recess bottom outer surfaces 116 and/or having a thermally conductive material or materials directly in contact with the top surfaces 177 of the IC packages 176 and with the recess bottom outer surfaces 116. For example, a thermally conductive material may be disposed between the top surface 177 and the recess bottom outer surface 116. Examples of such a thermally conductive material may include a thermal interface material (TIM) (e.g., a TIM paste) or a thermally conductive epoxy (which may be a fluid when applied and may harden upon curing, as known in the art).

Figure 9:
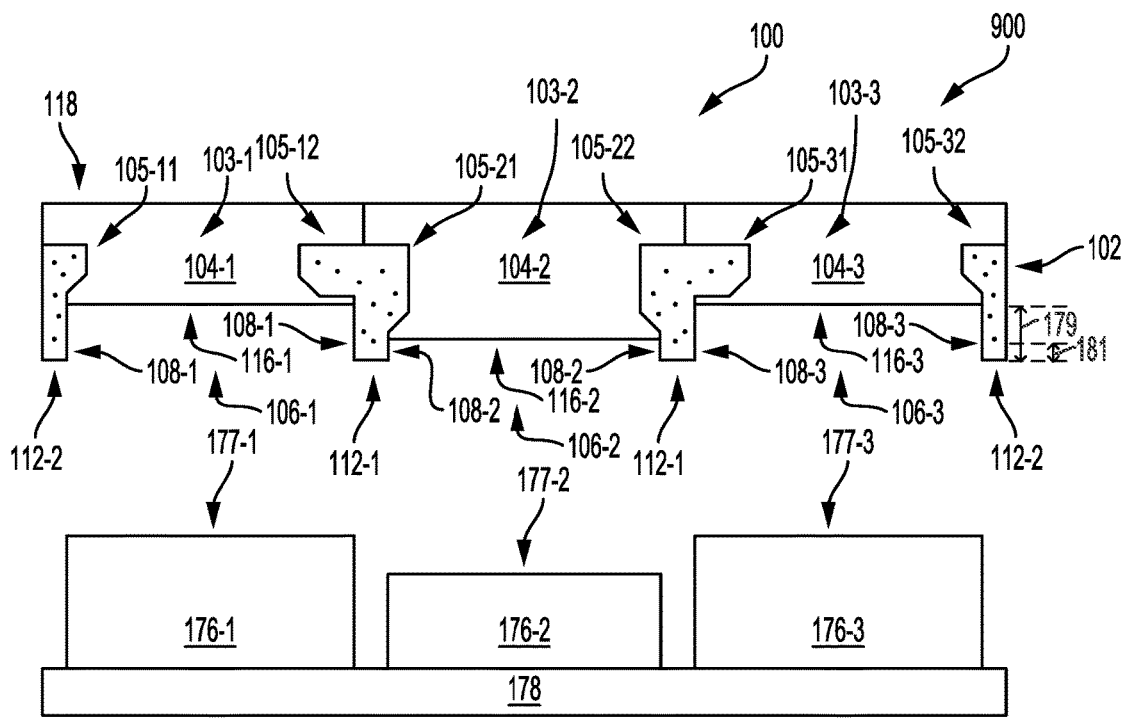
FIGS. 9 and 10 are exploded side cross-sectional views of other example heat spreaders positioned above multiple integrated circuit (IC) packages in a computing device, in accordance with various embodiments.

In the embodiment of the heat spreader 100 illustrated in FIG. 9, each of the inserts 104 corresponds to an IC package 176, as shown. This need not be the case. In some embodiments, a single insert 104 may "span" multiple IC packages 176 (e.g., as discussed below with reference to FIG. 10), and/or multiple inserts 104 may "cover" a single IC package 176. In some embodiments, multiple IC packages 176 may be disposed in a single recess 106. Different ones of the inserts 104 may have different dimensions (e.g., thickness) and may be formed of different materials. In particular, any one of the inserts 104 in a multi-insert heat spreader 100 may take the form of any of the embodiments of the inserts 104 disclosed herein.

In some embodiments of the heat spreaders 100 disclosed herein, the sidewalls 108 of a recess 106 may also be in thermal contact with one or more IC packages 176 disposed in the recess 106. In such embodiments, the recess 106 may "hug" an IC package 176 disposed therein and provide more surface contact for thermal transfer.

Figure 21:
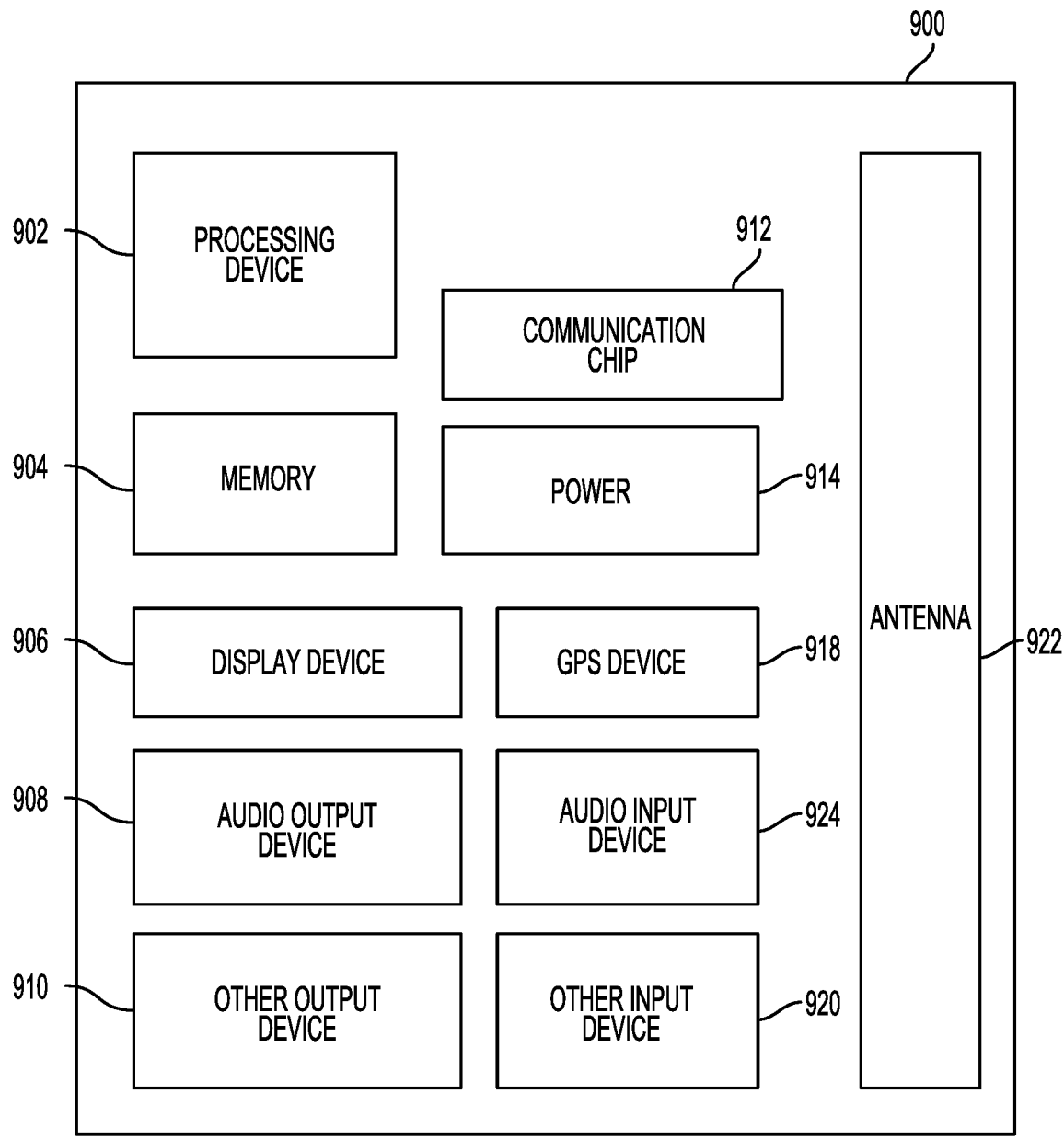
FIG. 21 is a block diagram of an example computing device that may include a heat spreader in accordance with the teachings of the present disclosure.

The IC packages 176 disposed in the recesses 106 of the heat spreaders 100 disclosed herein may include circuitry for performing any computing task. For example, an IC package 176 may include processing circuitry (e.g., a server processor, a digital signal processor, a central processing unit, a graphics processing unit, etc.), memory device circuitry, sensor circuitry, wireless or wired communication circuitry, or any other suitable circuitry. FIG. 21 (discussed below) illustrates an example of a computing device 900 that may include one or more of the heat spreaders 100 to thermally manage one or more of its components; any suitable ones of the components of the computing device 900 may be included in one or more IC packages 176 thermally managed by one or more heat spreaders 100.

Figure 10:
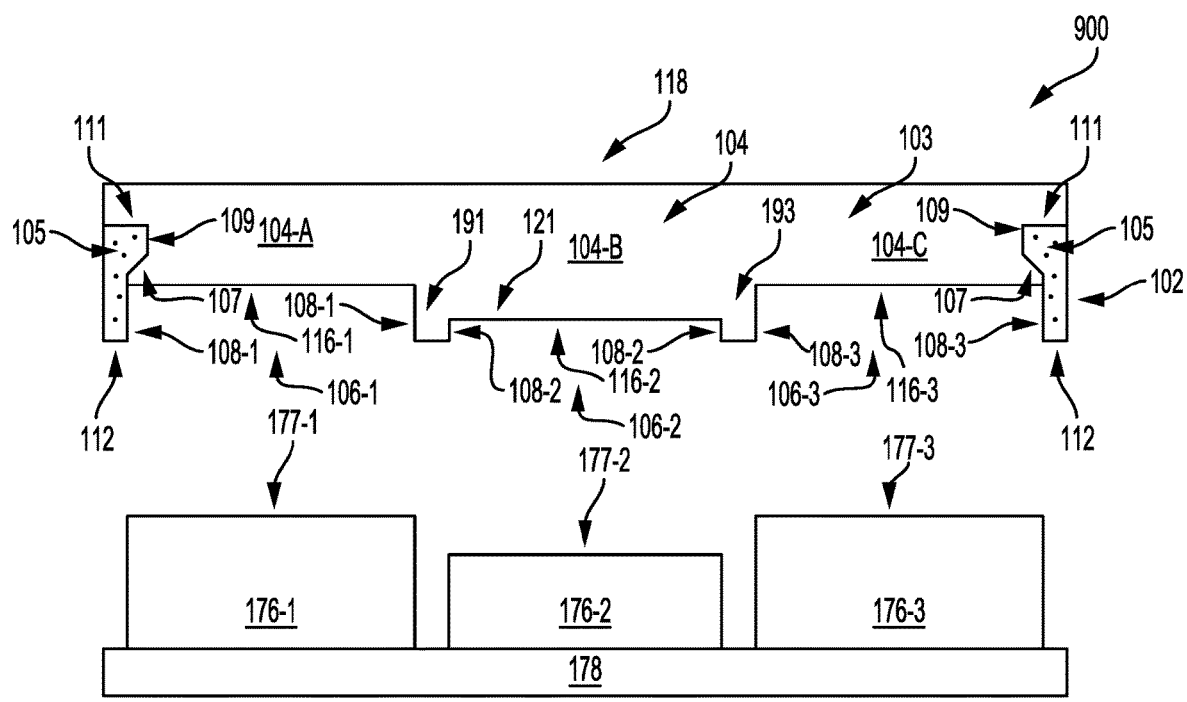
Figure 17:
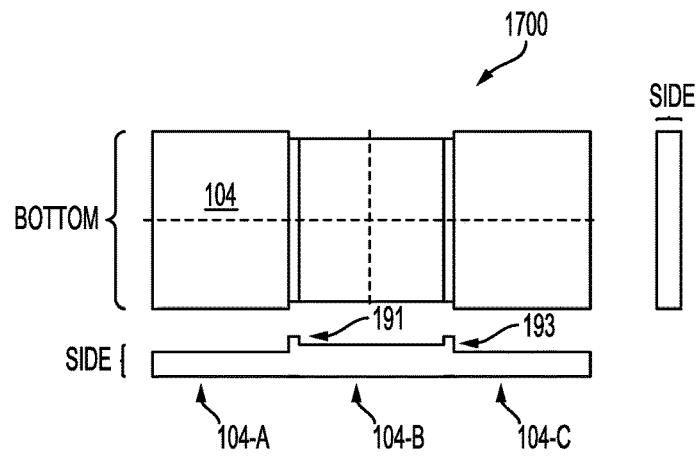
FIGS. 17-19 illustrate various stages in the manufacture of the example heat spreader of FIG. 10, in accordance with various embodiments.
Figure 18:
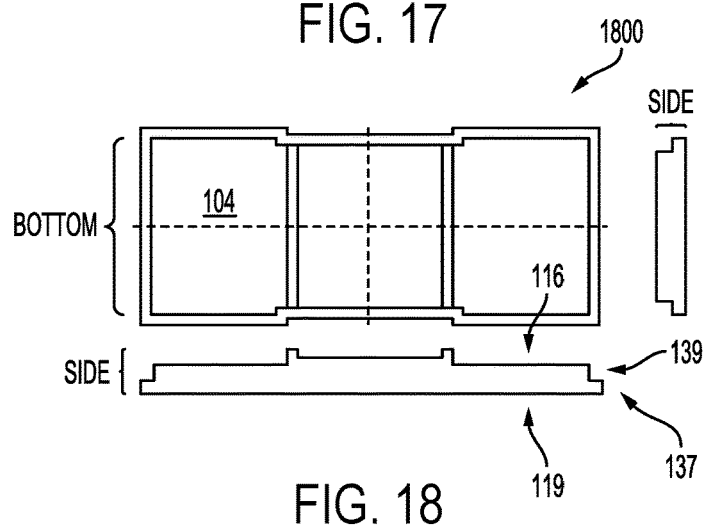
Figure 19:
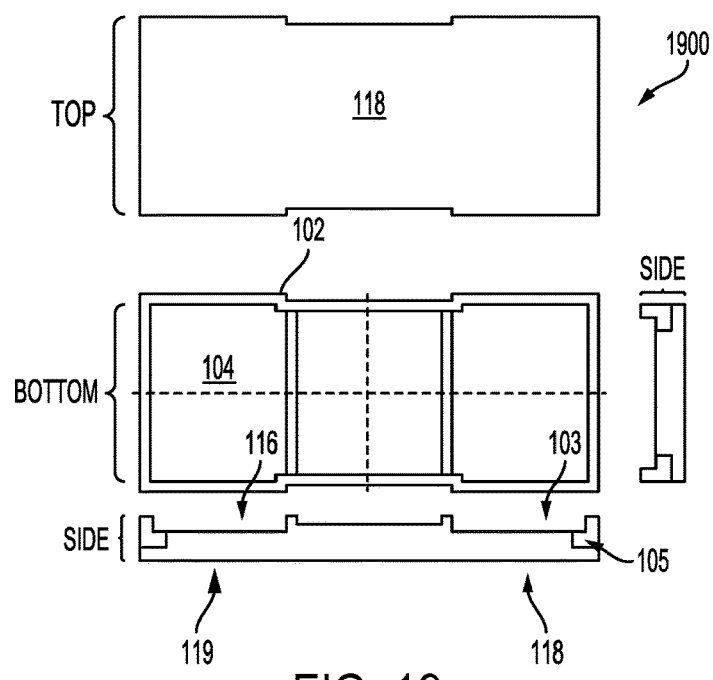

FIG. 10 is an exploded side cross-sectional view of another example heat spreader 100 positioned above multiple IC packages 176 in a computing device 900, in accordance with various embodiments. FIGS. 17-19, discussed below, illustrate various stages in the manufacture of the example heat spreader 100 of FIG. 10, in accordance with various embodiments. In the heat spreader 100 of FIG. 10, the insert 104 has projections 191 and 193 (that provide sidewalls 108 of different recesses 106, as discussed below), as well as regions 104-A, 104-B, and 104-C having different thicknesses. In some embodiments, the insert 104 may be formed from a multi-gauge strip of the second material, as discussed below with reference to FIGS. 17-19. In some embodiments, an insert 104 having regions of different thicknesses and/or projections may be included in a heat spreader 100 instead of or in addition to multiple inserts 104 (e.g., arranged as discussed above with reference to FIG. 9).

The heat spreader 100 of FIG. 10 may include a frame 102 formed of a first material, and an insert 104 formed of a second material having a higher thermal conductivity than the first material. The insert 104 may be disposed in the frame 102, and may be in contact with a top surface 111, a side surface 109, and a bottom surface 107 of a first projection 105 of the frame 102.

The heat spreader 100 may include a recess 106-1 having a recess bottom outer surface 116-1 and sidewalls 108-1, a recess 106-2 (adjacent to the recess 106-1) having a recess bottom outer surface 116-2 and sidewalls 108-2, and a recess 106-3 (adjacent to the recess 106-2) having a recess bottom outer surface 116-3 and sidewalls 108-3. A region 104-A of the insert 104 may provide the recess bottom outer surface 116-1, a region 104-B of the insert 104 may provide the recess bottom outer surface 116-2, and a region 104-C of the insert 104 may provide the recess bottom outer surface 116-3. As illustrated in FIG. 10 and as discussed above with reference to FIG. 9, in some embodiments of heat spreaders 100 having multiple recesses 106, the depths of different ones of the recesses 106 may be different.

The frame 102 may include an opening 103, and a first projection 105 of the frame 102 may extend into the opening 103. The recess 106-1 may have at least one sidewall 108-1 formed by the second projection 112 of the frame 102, and at least one sidewall 108-1 formed by a projection 191 of the insert 104. The recess 106-3 may have at least one sidewall 108-3 formed by the second projection 112 of the frame 102, and at least one sidewall 108-3 formed by a projection 193 of the insert 104. The recess 106-2 may have at least one sidewall 108-2 formed by the projection 191 of the insert 104 and at least one sidewall 108-2 formed by the projection 193 of the insert 104. The recess 106-2 may thus have at least two sidewalls 108 formed by the insert 104. The first projection 105 of FIG. 10 may take the form of any of the embodiments of the first projection 105 discussed herein. The insert 104 (e.g., the bottom surface 121 of the insert 104) may take any of the forms discussed above with reference to the inserts 104 of FIGS. 1-8. As illustrated in FIG. 10, the insert 104 may provide the top outer surface 118 of the heat spreader 100. In some embodiments, the top outer surface 118 may be flat.

As noted above, FIG. 10 is an exploded side cross-sectional view of an example heat spreader 100 positioned above multiple IC packages 176 in a computing device 900. The IC packages 176 are shown in FIG. 10 as mounted to a circuit board 178; during use, as discussed above with reference to FIG. 9, the recess bottom outer surface 116-1 of the heat spreader 100 may be brought into contact with the top surface 177-1 of the IC package 176-1 such that the IC package 176-1 is disposed in the recess 106-1; the recess bottom outer surface 116-2 may be brought into contact with the top surface 177-2 of the IC package 176-2 such that the IC package 176-2 is disposed in the recess 106-2; and the recess bottom outer surface 116-3 may be brought into contact with the top surface 177-3 of the IC package 176-3 such that the IC package 176-3 is disposed in the recess 106-3.

The heat spreader 100 may be secured to the IC packages 176 using an adhesive, for example. In some embodiments, the heat spreader 100 may be secured to the circuit board 178 (e.g., using an adhesive or a mechanical fastener) instead of or in addition to the top surfaces 177 of the IC packages 176. In some embodiments, multiple IC packages 176 may be disposed in a single recess 106.

The IC packages 176 may be in thermal contact with the recess bottom outer surfaces 116 of their respective recesses 106; this may include, for example, having the top surfaces 177 of the IC packages 176 in direct physical contact with the recess bottom outer surfaces 116 and/or having a thermally conductive material or materials directly in contact with the top surfaces 177 of the IC packages 176 and with the recess bottom outer surfaces 116. For example, a thermally conductive material may be disposed between the top surface 177 and the recess bottom outer surface 116. Examples of such a thermally conductive material may include a thermal interface material (TIM) (e.g., a TIM paste) or a thermally conductive epoxy (which may be a fluid when applied and may harden upon curing, as known in the art). The IC packages 176 disposed in the recesses 106 of the heat spreaders 100 disclosed herein may include circuitry for performing any computing task, such as any of the embodiments discussed above with reference to FIG. 9.

Figure 11:
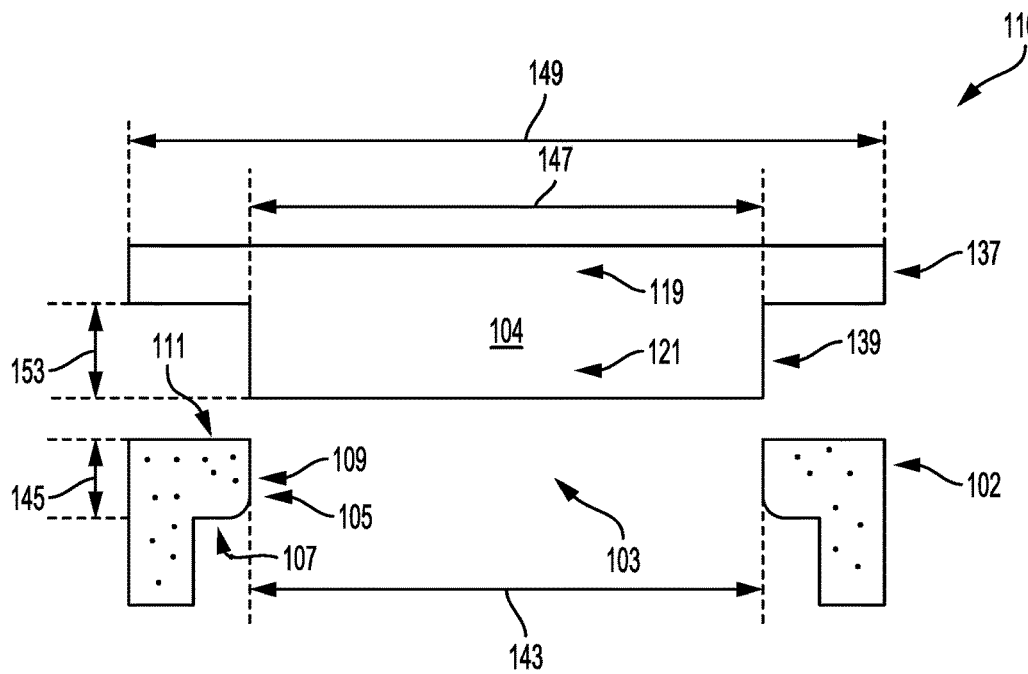
FIGS. 11-13 illustrate various stages in the manufacture of the example heat spreader of FIG. 1, in accordance with various embodiments.
Figure 12:
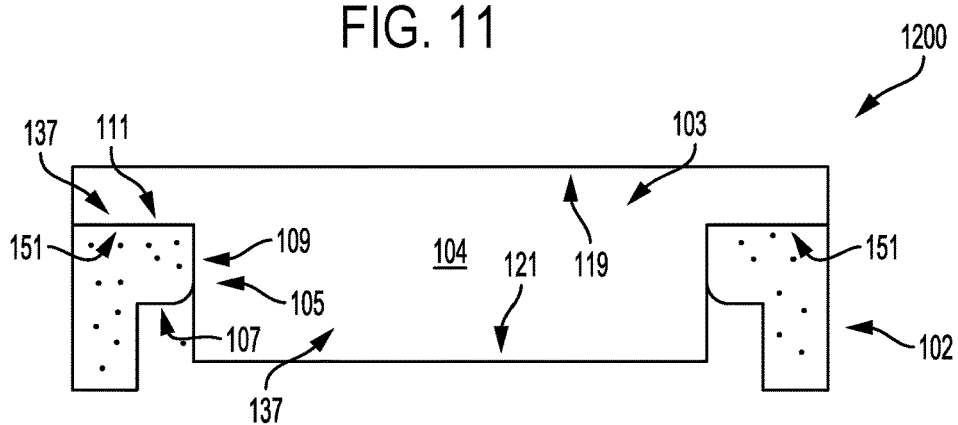
Figure 13:
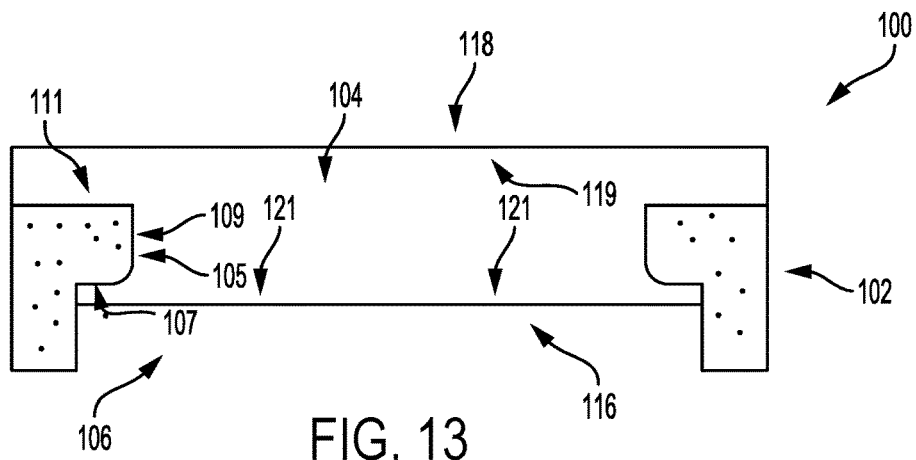

The heat spreaders 100 disclosed herein may be formed using any suitable manufacturing techniques. For example, FIGS. 11-13 illustrate various stages in the manufacture of the heat spreader 100 of FIG. 1, in accordance with various embodiments. While FIGS. 11-13 illustrate particular methods for manufacturing the heat spreader 100 of FIG. 1, any manufacturing techniques that can be used to form a heat spreader 100, in accordance with the present disclosure, may be used.

FIG. 11 depicts an assembly 1100 subsequent to providing an insert 104 and a frame 102. The frame 102 may take the form of any of the embodiment of the frame 102 discussed herein. For example, the frame 102 may be formed from a first material including stainless steel (e.g., in full-hard temper). The frame 102 may have an opening 103 and a first projection 105 extending into the opening 103. The first projection 105 may have a top surface 111, a side surface 109, and a bottom surface 107. The opening 103 may have a width 143 (e.g., as measured between opposing side surfaces 109), and the first projection 105 may have a height 145 (e.g., as measured between the bottom surface 107 and the top surface 111). In some embodiments, the frame 102 may be formed by trimming a block of the first material. In an example trimming process, a sheet of the first material may be shaped using a traditional punch and die setup, and the opening 103 may be punched out. In some embodiments, multiple frames 102 may be formed in parallel on a sheet of the first material, then singulated.

The materials and suitable geometry of the insert 104 may take the form of any of the embodiments of the insert 104 discussed herein. For example, the insert 104 may be formed from a second material including copper (e.g., nickel-plated copper). The insert 104 of FIG. 11 may have a T-shaped cross-section, as shown. In particular, the insert 104 may have a wide portion 137 and a narrow portion 139. The wide portion 137 may have a width 149, the narrow portion 139 may have a width 147, and the narrow portion 139 may have a height 153. In some embodiments, the insert 104 may be formed by stamping a block (e.g., a strip) of the second material to form portions of the second material into different thicknesses, then segmenting the stamped second material into individual inserts 104 having a wide portion 137 and a narrow portion 139. In some embodiments, the insert 104 may be formed by stamping a strip of the second material to form a step proximate to an edge of the strip, wherein the step demarcates the wide portion 137 and the narrow portion 139, as shown. This stamping may be performed with a relatively low-tonnage press (e.g., 300 tons or less for smaller and/or less complex parts), and may involve free metal flow and trimming as needed.

In some embodiments, the width 147 of the narrow portion 139 may be equal to the width 143 of the opening 103, plus an additional margin for an interference fit. In particular, the width 147 may be slightly greater than the width 143 so that the narrow portion 139 of the insert 104 may be interference fit in the opening 103 between the side surfaces 109 of the first projection 105, as discussed below with reference to FIG. 12. In some embodiments, it may be desirable for the first projection 105 to include a transition surface 115 between the top surface 111 and the side surface 109 (e.g., as illustrated in FIGS. 5 and 6) to facilitate inserting the narrow portion 139 of the insert 104 in the opening 103, as discussed below with reference to FIG. 12.

In some embodiments, the height 153 of the narrow portion 139 may be equal to the height 145 of the first projection 105, plus an additional margin for interlocking metal flow adjustment. In particular, the height 153 may be greater than the height 145 so that the material of the narrow portion 139 may be plastically flown around the bottom surface 107 of the first projection 105 to secure the insert 104 into the frame 102, as discussed below with reference to FIG. 13.

FIG. 12 depicts an assembly 1200 subsequent to interference fitting the insert 104 in the opening 103 of the frame 102 of the assembly 1100. The interference fitting may be performed by applying a force to the top surface 119 of the insert 104 and an opposing force to the frame 102, for example. The wide portion 137 of the insert 104 may be brought into contact with a top surface 151 of the frame 102 (which may or may not coincide with the top surface 111 of the first projection 105), and the narrow portion 139 of the insert 104 may be interference fit between the side surfaces 109 of the first projection 105. Subsequent to the interference fit, the bottom surface 121 of the insert 104 may extend below the bottom surface 107 of the first projection 105, as shown in FIG. 12.

In some embodiments, the insert 104 and/or the frame 102 may be at room temperature during the interference fitting. In other embodiments, the frame 102 may be heated during the interference fitting, causing the frame 102 to expand and possibly facilitating a stronger fit between the frame 102 and the insert 104 upon cooling ("shrink fitting").

FIG. 13 depicts an assembly 1300 subsequent to deforming the insert 104 around the first projection 105 of the frame 102 such that the insert 104 is in contact with the top surface 111, the side surface 109, and the bottom surface 107 of the first projection 105. In some embodiments, deformation of the insert 104 around the first projection 105 may include causing plastic flow of some of the material of the insert 104 in the narrow portion 139 around the bottom surface 107 of the first projection 105 in a forging operation. The insert 104 may be deformed by applying pressure to the top surface 119 of the insert 104 and opposing pressure to the bottom surface 121 of the insert 104. This pressure may be applied to any suitable tool (e.g., a punch) uniformly across the bottom surface 121 to cause the material of the insert 104 proximate to the bottom surface 121 to flow from the "inside out." In some embodiments, the insert 104 may be heated prior to deformation to facilitate the plastic flow; heating may make the insert 104 easier to forge, but may lower the strength of the resulting heat spreader 100. The bottom surface 121 of the insert 104 illustrated in FIG. 13 is flat; if a curved or otherwise contoured bottom surface 121 is desired (e.g., as discussed above with reference to FIGS. 7-8), a complementary shaped punch may be used to impart curvature to the bottom surface 121 during deformation of the insert 104. The strength of the first material of the frame 102 should be selected so that the frame 102 resists deformation during the deformation of the insert 104.

In this manner, a "weaker" material with higher thermal conductivity may be used as the insert, while a "stronger" material with lower thermal conductivity may provide the frame. Once the insert 104 has been deformed around the first projection 105 of the frame 102, the insert 104 may be effectively "interlocked" with the frame 102, resulting in a heat spreader 100 with mechanical integrity. In some embodiments, the interference fitting (FIG. 12) and deformation (FIG. 13) may be performed sequentially during a single movement at a single punch and die station.

Further processing operations may be performed on the heat spreader 100 of FIG. 13, such as polishing the top outer surface 118 (e.g., with a high-speed drill bit) and/or the recess bottom outer surface 116, laser-marking the heat spreader 100 (e.g., on the top outer surface 118 with indicia of the computing device 900 in which the heat spreader 100 will be included), applying any desired coatings to the heat spreader 100 (e.g., nickel-plating the heat spreader 100), or any other desired processing operations.

In some embodiments, the manufacture of the heat spreader 100 may include forming the frame 102 and the insert 104. For example, FIGS. 14-16 illustrate various stages in the manufacture of the example heat spreader 100 of FIG. 9, in accordance with various embodiments. While FIGS. 14-16 illustrate particular methods for manufacturing the heat spreader 100 of FIG. 9, any manufacturing techniques that can be used to form a heat spreader 100, in accordance with the present disclosure, may be used.

FIG. 14 illustrates bottom and side views of an assembly 1400 including three inserts 104-1, 104-2, and 104-3. The inserts 104 of the assembly 1400 may have different footprints; for example, as shown in FIG. 14, the footprints of the inserts 104-1 and 104-3 may be the same, while the footprint of the insert 104-2 may be different from the others. The thicknesses of the inserts 104 of the assembly 1400 (illustrated in the bottom side view of FIG. 14) may be different; for example, as shown in FIG. 14, the thicknesses of the inserts 104-1 and 104-3 may be the same, while the thickness of the insert 104-2 may be different from the others. The inserts 104 of FIG. 14 may be formed of any suitable second material, such as copper, aluminum, or brass, in accordance with any of the embodiments discussed above. The inserts 104 of FIG. 14 may each be a different single-gauge strip of the second material (e.g., copper). In some embodiments, the strips may be in a fully annealed condition (O temper) to facilitate easy metal flow during stamping and deformation around the frame 102, as discussed below.

FIG. 15 illustrates bottom and side views of an assembly 1500 after stamping the three inserts 104 of the assembly 1400 to form steps proximate to the edges of the inserts 104, as shown in FIG. 15. After stamping, each of the inserts 104 may include a narrow portion 139 proximate to the bottom surface 121 of the insert 104 and a wide portion 137 proximate to the top surface 119 of the insert 104. The formation of steps may be performed in accordance with any of the embodiments discussed above with reference to FIG. 11.

FIG. 16 illustrates top, bottom, and side views of an assembly 1600 (which may be the heat spreader 100 of FIG. 9) subsequent to interference fitting the inserts 104-1, 104-2, and 104-3 into the openings 103-1, 103-2, and 103-3 in the frame 102, and deforming the inserts 104 around the first projections 105 of the frame 102 to secure the inserts 104 in the frame 102. The deformation may be performed in accordance with any of the embodiments discussed above with reference to FIG. 13, for example. Further processing operations may be performed on the assembly 1600 as desired, such as polishing and nickel-plating, to form the final heat spreader 100 of FIG. 9.

FIGS. 17-19 illustrate various stages in the manufacture of the example heat spreader 100 of FIG. 10, in accordance with various embodiments. While FIGS. 17-19 illustrate particular methods for manufacturing the heat spreader 100 of FIG. 10, any manufacturing techniques that can be used to form a heat spreader 100, in accordance with the present disclosure, may be used.

FIG. 17 illustrates bottom and side views of an assembly 1700 including an insert 104. As discussed above with reference to FIG. 10, the insert 104 may have regions 104-A, 104-B, and 104-C having different thicknesses, and may include projections 191 and 193. The insert 104 of FIG. 17 may be formed of any suitable second material, such as copper, aluminum, or brass, in accordance with any of the embodiments discussed above. The insert 104 of FIG. 17 may be a multi-gauge strip of the second material (e.g., copper), and the regions 104-1, 104-2, and 104-3 may have different tempers, if desired. In some embodiments, the strip may be in a fully annealed condition (O temper) to facilitate easy metal flow during stamping and deformation around the frame 102, as discussed below.

FIG. 18 illustrates bottom and side views of an assembly 1800 after stamping the insert 104 of the assembly 1700 to form a step proximate to the edge of the insert 104, as shown in FIG. 18. After stamping, the insert 104 may include a narrow portion 139 proximate to the bottom surface 121 of the insert 104 and a wide portion 137 proximate to the top surface 119 of the insert 104. The formation of steps may be performed in accordance with any of the embodiments discussed above with reference to FIG. 11.

FIG. 19 illustrates top, bottom, and side views of an assembly 1900 (which may be the heat spreader 100 of FIG. 9) subsequent to interference fitting the insert 104 into the opening 103 in the frame 102, and deforming the insert 104 around the first projection 105 of the frame 102 to secure the insert 104 in the frame 102. The deformation may be performed in accordance with any of the embodiments discussed above with reference to FIG. 13, for example. Further processing operations may be performed on the assembly 1900 as desired, such as polishing and nickel-plating, to form the final heat spreader 100 of FIG. 10.

FIG. 20 is a flow diagram of a method 2000 of manufacturing a heat spreader, in accordance with various embodiments. While the operations of the method 2000 are arranged in a particular order in FIG. 20 and illustrated once each, in various embodiments, one or more of the operations may be repeated (e.g., when the heat spreader includes multiple inserts).

At 2002, an insert may be interference fit in an opening of a frame. The frame may be formed of a first material, a projection of the frame may extend into the opening, the projection may have a top surface, a side surface, and a bottom surface, and the insert may be formed of a second material having a higher thermal conductivity than the first material. For example, as discussed above with reference to FIGS. 11-12, an insert 104 may be interference fit in an opening 103 of a frame 102. A first projection 105 of the frame 102 may extend into the opening 103, the first projection may have a top surface 112, a side surface 109, and a bottom surface 107, and the insert 104 may be formed of a second material having a higher thermal conductivity than the first material. The insert, opening, and frame of 2002 may be formed in accordance with any of the embodiments of the insert 104, opening 103, and frame 102, respectively, disclosed herein.

At 2004, plastic flow of the insert may be caused to deform the insert around the projection such that the insert is in contact with the top surface, the side surface, and the bottom surface of the projection. For example, as discussed above with reference to FIG. 13, pressure and/or heat may be applied to the insert 104 (e.g., at the bottom surface 121 of the insert 104 and at the top surface 119 of the insert 104) to cause plastic flow of the material of the insert 104 to deform the insert 104 around the first projection 105 so that the insert 104 is in contact with the top surface 111, the side surface 109, and the bottom surface 107 of the first projection 105.

In some embodiments, further processing operations may follow 2004, such as nickel-plating the heat spreader, polishing a surface of the heat spreader, and/or laser-marking a surface of the heat spreader.

FIG. 21 is a block diagram of an example computing device 900 that may include any of the embodiments of the heat spreader 100 disclosed herein. A number of components are illustrated in FIG. 21 as included in the computing device 900, but any one or more of these components may be omitted or duplicated, as suitable for the application.

Additionally, in various embodiments, the computing device 900 may not include one or more of the components illustrated in FIG. 21, but the computing device 900 may include interface circuitry for coupling to the one or more components. For example, the computing device 900 may not include a display device 906, but may include display device interface circuitry (e.g., a connector and driver circuitry) to which a display device 906 may be coupled. In another set of examples, the computing device 900 may not include an audio input device 924 or an audio output device 908, but may include audio input or output device interface circuitry (e.g., connectors and supporting circuitry) to which an audio input device 924 or audio output device 908 may be coupled. Any one or more of the components of the computing device 900 may be included in one or more IC packages that may be in thermal contact with any of the heat spreaders 100 disclosed herein.

The computing device 900 may include a processing device 902 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 902 may include one or more digital signal processors (DSPs), application-specific integrated circuits (ASICs), central processing units (CPUs), graphics processing units (GPUs), cryptoprocessors, server processors, or any other suitable processing devices. The computing device 900 may include a memory 904, which may itself include one or more memory devices such as volatile memory (e.g., dynamic random access memory (DRAM)), non-volatile memory (e.g., read-only memory (ROM)), flash memory, solid state memory, and/or a hard drive.

In some embodiments, the computing device 900 may include a communication chip 912 (e.g., one or more communication chips). For example, the communication chip 912 may be configured for managing wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not.

The communication chip 912 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 912 may operate in accordance with a Global System for Mobile communication (GSM), General Packet Radio Service (GPRS), Universal Mobile Telecommunications System (UMTS), High Speed Packet Access (HSPA), Evolved HSPA (E-HSPA), or LTE network. The communication chip 912 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 912 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 912 may operate in accordance with other wireless protocols in other embodiments. The computing device 900 may include an antenna 922 to facilitate wireless communications and/or to receive other wireless communications (such as AM or FM radio transmissions).

In some embodiments, the communication chip 912 may manage wired communications, such as electrical, optical, or any other suitable communication protocols (e.g., the Ethernet). As noted above, the communication chip 912 may include multiple communication chips. For instance, a first communication chip 912 may be dedicated to shorter-range wireless communications such as Wi-Fi or Bluetooth, and a second communication chip 912 may be dedicated to longer-range wireless communications such as GPS, EDGE, GPRS, CDMA, WiMAX, LTE, EV-DO, or others. In some embodiments, a first communication chip 912 may be dedicated to wireless communications, and a second communication chip 912 may be dedicated to wired communications.

The computing device 900 may include battery/power circuitry 914. The battery/power circuitry 914 may include one or more energy storage devices (e.g., batteries or capacitors) and/or circuitry for coupling components of the computing device 900 to an energy source separate from the computing device 900 (e.g., AC line power).

The computing device 900 may include a display device 906 (or corresponding interface circuitry, as discussed above). The display device 906 may include any visual indicators, such as a heads-up display, a computer monitor, a projector, a touchscreen display, a liquid crystal display (LCD), a light-emitting diode display, or a flat panel display, for example.

The computing device 900 may include an audio output device 908 (or corresponding interface circuitry, as discussed above). The audio output device 908 may include any device that generates an audible indicator, such as speakers, headsets, or earbuds, for example.

The computing device 900 may include an audio input device 924 (or corresponding interface circuitry, as discussed above). The audio input device 924 may include any device that generates a signal representative of a sound, such as microphones, microphone arrays, or digital instruments (e.g., instruments having a musical instrument digital interface (MIDI) output).

The computing device 900 may include a global positioning system (GPS) device 918 (or corresponding interface circuitry, as discussed above). The GPS device 918 may be in communication with a satellite-based system and may receive a location of the computing device 900, as known in the art.

The computing device 900 may include another output device 910 (or corresponding interface circuitry, as discussed above). Examples of the other output device 910 may include an audio codec, a video codec, a printer, a wired or wireless transmitter for providing information to other devices, or an additional storage device.

The computing device 900 may include another input device 920 (or corresponding interface circuitry, as discussed above). Examples of the other input device 920 may include an accelerometer, a gyroscope, an image capture device, a keyboard, a cursor control device such as a mouse, a stylus, a touchpad, a bar code reader, a Quick Response (QR) code reader, any sensor, or a radio frequency identification (RFID) reader.

The following paragraphs describe examples of various ones of the embodiments disclosed herein.

Example 1 is a heat spreader, including: a frame formed of a first material, wherein the frame includes an opening, a projection of the frame extends into the opening, and the projection has a top surface, a side surface, and a bottom surface; a recess having at least one sidewall formed by the frame; and an insert formed of a second material having a higher thermal conductivity than the first material, wherein the insert is disposed in the frame and in contact with the top surface, the side surface, and the bottom surface of the projection; wherein the second material has a higher thermal conductivity than the first material.

Example 2 may include the subject matter of Example 1, wherein the first material has a higher-yield strength than the second material.

Example 3 may include the subject matter of any of Examples 1-2, and may further specify that the first material has a higher coefficient of thermal expansion than the second material.

Example 4 may include the subject matter of any of Examples 1-3, and may further specify that the first material has a higher toughness than the second material.

Example 5 may include the subject matter of any of Examples 1-4, and may further specify that the first material includes stainless steel, aluminum, or brass.

Example 6 may include the subject matter of any of Examples 1-5, and may further specify that the second material includes copper.

Example 7 may include the subject matter of any of Examples 1-6, and may further specify that the second material includes aluminum or brass.

Example 8 may include the subject matter of any of Examples 1-7, and may further specify that a transition surface between the bottom surface and the side surface is curved.

Example 9 may include the subject matter of any of Examples 1-7, and may further specify that a transition surface between the bottom surface and the side surface is flat.

Example 10 may include the subject matter of any of Examples 1-9, and may further specify that a transition surface between the top surface and the side surface is flat.

Example 11 may include the subject matter of any of Examples 1-10, and may further specify that the insert has a top surface and a bottom surface, and the top surface of the insert provides a top outer surface of the heat spreader.

Example 12 may include the subject matter of any of Examples 1-11, and may further specify that the recess is a first recess and the heat spreader further includes a second recess having at least one sidewall formed by the frame.

Example 13 may include the subject matter of any of Examples 1-12, and may further specify that the recess has at least one sidewall formed by the insert.

Example 14 may include the subject matter of Example 13, and may further specify that the recess is a first recess, the first recess has three sidewalls formed by the frame, and the heat spreader further includes a second recess having two sidewalls formed by the frame.

Example 15 may include the subject matter of any of Examples 1-14, and may further specify that the insert is a first insert, the opening is a first opening, the projection is a first projection, the frame includes a second opening different from the first opening, a second projection of the frame extends into the second opening, the second projection has a top surface, side surface, and a bottom surface, and the heat spreader further includes a second insert formed of a third material different from the first material, wherein the second insert is disposed in the frame and in contact with the top surface of the second projection, the side surface of the second projection, and the bottom surface of the second projection.

Example 16 may include the subject matter of Example 15, and may further specify that the first and second inserts have different footprints.

Example 17 may include the subject matter of any of Examples 15-16, and may further specify that the second and third materials are a same material.

Example 18 may include the subject matter of any of Examples 1-17, and may further specify that the insert has a top surface and a bottom surface, and the bottom surface has concave curvature with reference to the top surface.

Example 19 may include the subject matter of any of Examples 1-17, and may further specify that the insert has a top surface and a bottom surface, and the bottom surface has convex curvature with reference to the top surface.

Example 20 may include the subject matter of any of Examples 1-19, and may further specify that a top surface of the heat spreader is flat.

Example 21 may include the subject matter of any of Examples 1-20, and may further specify that the insert is nickel-plated.

Example 22 may include the subject matter of any of Examples 1-21, and may further specify that the heat spreader is nickel-plated.

Example 23 is a method of manufacturing a heat spreader, including: interference fitting an insert in an opening of a frame, wherein the frame is formed of a first material, a projection of the frame extends into the opening, the projection has a top surface, a side surface, and a bottom surface, and the insert is formed of a second material having a higher thermal conductivity than the first material; and deforming the insert around the projection such that the insert is in contact with the top surface, the side surface, and the bottom surface of the projection.

Example 24 may include the subject matter of Example 23, and may further specify that: prior to deforming the insert, the insert has a wide portion and a narrow portion; and interference fitting the insert in the opening of the frame includes interference fitting the narrow portion in the opening while the wide portion is disposed above a top surface of the frame.

Example 25 may include the subject matter of Example 24, and may further specify that a cross-section of the insert has a T-shape.

Example 26 may include the subject matter of any of Examples 23-25, and may further specify that, prior to deforming the insert, the insert has a flat bottom surface; and causing plastic flow of the insert includes imparting curvature to the bottom surface.

Example 27 may include the subject matter of any of Examples 23-26, and may further specify that the insert includes electrolytic tough-pitch copper or deoxidized high-phosphorus copper.

Example 28 may include the subject matter of any of Examples 23-26, and may further specify that the insert includes gilding metal.

Example 29 may include the subject matter of any of Examples 23-20, and may further include forming the insert by stamping a strip of the second material.

Example 30 may include the subject matter of Example 29, and may further specify that the strip of the second material has different regions with different thicknesses.

Example 31 may include the subject matter of any of Examples 29-30, and may further specify that stamping the strip of the second material comprises forming a step proximate to an edge of the strip of the second material.

Example 32 may include the subject matter of any of Examples 23-31, and may further include forming the frame by trimming.

Example 33 may include the subject matter of any of Examples 23-32, and may further specify that deforming the insert comprises applying pressure to a top surface of the insert and a bottom surface of the insert.

Example 34 may include the subject matter of Example 33, and may further specify that deforming the insert further comprises heating the insert.

Example 35 may include the subject matter of any of Examples 23-27 and 29-34, and may further specify that the insert is formed from nickel-plated copper.

Example 36 may include the subject matter of any of Examples 23-27 and 29-34, and may further include, after deforming the insert, nickel-plating the frame and insert.

Example 37 may include the subject matter of any of Examples 23-36, and may further specify that deforming the insert comprises causing plastic flow of some of the material of the insert.

Example 38 is a computing device, including: a heat spreader, including a frame formed of a first material, wherein the frame includes an opening, a projection of the frame extends into the opening, and the projection has a top surface, a side surface, and a bottom surface, a recess having at least one sidewall formed by the frame, and an insert formed of a second material having a higher thermal conductivity than the first material, wherein the insert is disposed in the frame and in contact with the top surface, the side surface, and the bottom surface of the projection; and an integrated circuit (IC) package disposed in the recess.

Example 39 may include the subject matter of Example 38, and may further include an adhesive disposed between a surface of the IC package and a surface of the heat spreader.

Example 40 may include the subject matter of any of Examples 38-39, and may further specify that: the recess is a first recess; the heat spreader further comprises a second recess having at least one sidewall formed by the frame; the IC package is a first IC package; and the computing device further comprises a second IC package disposed in the second recess.

Example 41 may include the subject matter of any of Examples 38 and 40, and may further specify that the IC package includes a server processor.

The invention claimed is:

1. A heat spreader, comprising:
a frame including a first material, wherein the frame includes a first opening, a first projection of the frame extends into the first opening, and the first projection has a top surface, a side surface, and a bottom surface, and wherein the frame includes a second opening different from the first opening, a second projection of the frame extends into the second opening, and the second projection has a top surface, side surface, and a bottom surface;
a recess having at least one sidewall provided by the frame;
a first insert including a second material having a higher thermal conductivity than the first material, wherein the first insert is in the frame and in contact with the top surface of the first projection, the side surface of the first projection, and the bottom surface of the first projection; and
a second insert including a third material different from the first material, wherein the second insert is in the frame and in contact with the top surface of the second projection, the side surface of the second projection, and the bottom surface of the second projection.

2. The heat spreader of claim 1, wherein the first material has a greater yield strength than the second material.

3. The heat spreader of claim 1, wherein the first material has a greater toughness than the second material.

4. The heat spreader of claim 1, wherein the first material includes stainless steel, aluminum, or brass.

5. The heat spreader of claim 1, wherein the second material includes copper.

6. The heat spreader of claim 1, wherein the first insert has a top surface and a bottom surface, and the top surface of the first insert at least partially provides a top outer surface of the heat spreader.

7. The heat spreader of claim 1, wherein the recess is a first recess and the heat spreader further comprises:
a second recess having at least one sidewall provided by the frame.

8. The heat spreader of claim 1, wherein the recess has at least one sidewall provided by the first insert.

9. The heat spreader of claim 8, wherein the recess is a first recess, the first recess has three sidewalls provided by the frame, and the heat spreader further comprises:
a second recess having two sidewalls provided by the frame.

10. The heat spreader of claim 1, wherein the first insert has a top surface and a bottom surface, and the bottom surface has curvature with reference to the top surface.

11. The heat spreader of claim 1, wherein the insert has a coating that includes nickel.

12. The heat spreader of claim 1, wherein the heat spreader has a coating that includes nickel.

13. The heat spreader of claim 1, wherein the second material and the third material have a same material composition.

14. A heat spreader, comprising:
a frame including a first material, wherein the frame includes an opening, a projection of the frame extends into the opening, and the projection has a top surface, a side surface, and a bottom surface;
a recess having a first sidewall provided by the frame; and
an insert including a second material having a higher thermal conductivity than the first material, wherein the insert is in the frame and in contact with the top surface, the side surface, and the bottom surface of the projection, wherein the recess has a second sidewall provided by the insert and a bottom surface provided by the insert, and wherein the bottom surface is different from the second sidewall.

15. The heat spreader of claim 14, wherein the first material has a greater yield strength than the second material, or the first material has a greater toughness than the second material.

16. The heat spreader of claim 14, wherein the first material includes stainless steel, aluminum, or brass.

17. The heat spreader of claim 14, wherein the heat spreader includes nickel.

18. A heat spreader, comprising:
a frame including a first material, wherein the frame includes an opening, a projection of the frame extends into the opening, and the projection has a top surface, a side surface, and a bottom surface;
a recess having at least one sidewall provided by the frame; and
an insert including a second material having a higher thermal conductivity than the first material, wherein:
the insert is in the frame and in contact with the top surface, the side surface, and the bottom surface of the projection,
the insert has a top surface and a bottom surface, and the bottom surface has curvature with reference to the top surface, and the curvature is concave or convex.

19. The heat spreader of claim 18, wherein the curvature is concave.

20. The heat spreader of claim 18, wherein the curvature is convex.

21. The heat spreader of claim 18, wherein the frame includes a metal.

* * * * *